US012658354B2

(12) United States Patent
Stephenson et al.

(10) Patent No.: US 12,658,354 B2
(45) Date of Patent: Jun. 16, 2026

(54) EMBEDDED MAGNETIC COMPONENT TRANSFORMER DEVICE

(71) Applicant: Murata Manufacturing Co., Ltd., Nagaokakyo (JP)

(72) Inventors: Neil Stephenson, Milton Keynes (GB); Frank Warnes, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 814 days.

(21) Appl. No.: 18/081,074

(22) Filed: Dec. 14, 2022

(65) Prior Publication Data

US 2023/0187119 A1 Jun. 15, 2023

(30) Foreign Application Priority Data

Dec. 15, 2021 (GB) ..................................... 2118179

(51) Int. Cl.
*H01F 27/28* (2006.01)
*H01F 27/29* (2006.01)
(Continued)

(52) U.S. Cl.
CPC ......... *H01F 27/2804* (2013.01); *H01F 27/29* (2013.01); *H02M 3/337* (2013.01); (Continued)

(58) Field of Classification Search
CPC .... H01F 27/2895; H01F 17/06; H01F 17/062; H01F 30/16; H01F 2038/305; (Continued)

(56) References Cited

U.S. PATENT DOCUMENTS

| | | | |
|---|---|---|---|
| 4,177,509 A | 12/1979 | Bullinga | |
| 2016/0111197 A1* | 4/2016 | Kneller | H01F 27/2804 336/200 |

(Continued)

FOREIGN PATENT DOCUMENTS

| | | |
|---|---|---|
| GB | 2528990 A | 2/2016 |
| GB | 2529235 A | 2/2016 |

OTHER PUBLICATIONS

Official Communication issued in United Kingdom Patent Application No. GB2118179.7, mailed on Jun. 14, 2022.

*Primary Examiner* — Tszfung J Chan
(74) *Attorney, Agent, or Firm* — Keating & Bennett, LLP

(57) ABSTRACT

An embedded magnetic component transformer device includes primary, secondary, and auxiliary windings that are defined by conductive vias connected by conductive traces. The conductive traces and vias of the auxiliary winding are arranged between the conductive traces and vias of respective first and second portions of the primary winding, so that the auxiliary winding is provided substantially in the center of the width of the PCB. Power connections are provided at respective opposing edges of the device, and surface mounted transistors are provided close to the primary winding portions between the auxiliary winding and the edge of the device. The device provides an efficient utilization of the surface conductive traces such that large areas of the surface remain for other functions, such as ground plates. The thermal properties of the device are balanced by distributing the transistors and the power connections.

20 Claims, 12 Drawing Sheets

(51) Int. Cl.

| | |
|---|---|
| *H02M 3/337* | (2006.01) |
| *H05K 1/11* | (2006.01) |
| *H05K 1/16* | (2006.01) |
| *H05K 1/181* | (2026.01) |
| *H01F 27/26* | (2006.01) |

(52) U.S. Cl.
  CPC ............ *H05K 1/117* (2013.01); *H05K 1/165* (2013.01); *H05K 1/181* (2013.01); *H01F 27/266* (2013.01); *H01F 2027/2809* (2013.01); *H01F 27/2895* (2013.01); *H05K 2201/086* (2013.01); *H05K 2201/09072* (2013.01); *H05K 2201/10015* (2013.01); *H05K 2201/10022* (2013.01); *H05K 2201/10166* (2013.01); *H05K 2201/10174* (2013.01); *H05K 2201/10522* (2013.01)

(58) Field of Classification Search
  CPC ........ H01F 27/2804; H01F 2027/2809; H01F 17/0006; H01F 17/0013; H01F 5/003; H05K 1/117; H05K 1/165; H05K 1/181; H05K 2201/086; H05K 2201/09072; H05K 2201/10015; H05K 2201/10022; H05K 2201/10166; H05K 2201/10174; H05K 2201/10522
  USPC ........................................ 336/200, 229, 232
  See application file for complete search history.

(56)          References Cited

U.S. PATENT DOCUMENTS

| | | | | |
|---|---|---|---|---|
| 2016/0111200 A1* | 4/2016 | Kneller | ................... | H01F 27/38 |
| | | | | 336/200 |
| 2016/0111965 A1* | 4/2016 | Wang | ...................... | H01F 19/06 |
| | | | | 363/21.04 |
| 2016/0111966 A1* | 4/2016 | Wang | .................. | H01F 27/2804 |
| | | | | 336/200 |
| 2016/0254088 A1* | 9/2016 | Kneller | ................... | H01F 27/29 |
| | | | | 361/268 |
| 2017/0316872 A1* | 11/2017 | Kneller | ................... | H02M 5/18 |

* cited by examiner

EMBEDDED MAGNETIC COMPONENT TRANSFORMER DEVICE

CROSS REFERENCE TO RELATED APPLICATIONS

This application claims the benefit of priority to GB Patent Application No. 2118179.7 filed on Dec. 15, 2021. The entire contents of this application are hereby incorporated herein by reference.

BACKGROUND OF THE INVENTION

1. Field of the Invention

The invention relates to a device including an embedded magnetic component transformer, and in particular to an embedded magnetic component transformer device with an improved winding design, increasing the electrical performance of the transformer.

2. Description of the Related Art

It is known to provide low-profile transformers and inductors in which the magnetic components are embedded in a cavity formed in a resin substrate, with the necessary input and output electrical connections of the transformer or inductor formed on the substrate surface. A printed circuit board (PCB) of a power supply device can be formed by adding layers of solder resist and copper plating to the top and/or bottom opposing surfaces of the substrate arranged in the substrate's thickness direction. The necessary electronic components of the device may then be surface mounted on the PCB.

Compared to conventional transformers, an embedded design allows a significantly thinner and more compact device to be built. This is desirable because typically the space available for mounting the transformer device onto a separate or secondary PCB, for example, a motherboard of an electronics device, will be very limited. A transformer component with a smaller footprint will therefore enable more components to be mounted onto the secondary PCB, or enable the overall size of the PCB and therefore the entire device to be reduced.

For the purposes of illustration, a circuit diagram for a self-oscillating push-pull (Royer) circuit is shown in FIG. 1, and described in more detail later. Corresponding surface PCB configurations are shown schematically in FIGS. 3 and 4, and FIGS. 6 and 7, respectively. The components of the self-oscillating push-pull circuit can all be mounted in and/or on the same substrate, forming a self-contained component.

As will be explained in connection with FIGS. 2 to 7, it can be difficult to translate a circuit schematic (such as that shown in FIG. 1) into a well laid out PCB due to constraints arising from the small surface area of the device, and the need to balance the electrical components on the circuit in terms of the power they require or the heat that they produce. As shown in FIGS. 3, 4, 6 and 7, attempts to balance such requirements often result in a complex criss-crossing of conductive surface tracks, cutting through the copper plane of the surface and making remaining areas unsuitable to be used as effective heatsinks. Complex conductive surface tracks also add unnecessary tracking losses and leakage inductance.

Similarly, the position of any components that generate heat, such as surface mounted transistors, and the position of any power connections to the device must be carefully considered. Such components need to be located at a convenient position on the PCB, so that they are available for use in the transformer circuit, without unduly affecting the performance of the components surrounding them.

The inventors have therefore appreciated that it would be desirable to provide an embedded transformer device including an improved circuit layout balancing the constraints discussed above while keeping the device small in size.

SUMMARY OF THE INVENTION

A preferred embodiment of the present invention includes an embedded magnetic component transformer device including: a substrate with opposing first and second surfaces arranged in a thickness direction of the substrate; conductive traces disposed on the first and second surfaces; conductive vias extending from the first surface to the second surface, wherein the conductive traces and the conductive vias together define primary, secondary, and auxiliary windings of a transformer; the primary and auxiliary windings being arranged on a primary side of a central isolation region the transformer; and the secondary winding being arranged on the secondary side of the central isolation region of the transformer; wherein a first plurality of conductive traces and vias define the auxiliary winding on the primary side, and wherein a second and third plurality of conductive traces define the primary winding on the primary side, the first plurality of conductive traces and vias defining the auxiliary winding being arranged in between the second and third pluralities of conductive traces and vias defining the primary winding.

In preferred embodiments, the device includes a width dimension and a length dimension, with the primary side and secondary sides arranged along the length dimension, and opposing first and second device edges arranged along the width dimension.

In preferred embodiments, the first and second device edges include edge castellations that connects to a power supply.

In preferred embodiments, the first device edge includes at least a first edge castellation that connect to one rail of a power supply, and the second device edge includes a second edge castellation that connects to another rail of a power supply.

In preferred embodiments, the first plurality of conductive traces and vias defining the auxiliary winding are positioned substantially equidistant from the first and second device edges arranged along the width direction.

In preferred embodiments, the second and third pluralities of conductive traces and vias defining the primary winding extend from a position adjacent the auxiliary winding towards the respective first and second device edges of the device to terminate adjacent the respective first and second device edges.

In preferred embodiments, the device includes a plurality of surface mounted electronic components mounted on at least one of the first surface or the second surface, and connected to the conductive traces.

In preferred embodiments, the plurality of surface mounted electronic components include a first transistor and a second transistor that supply electrical signals to the primary winding, wherein the first transistor is arranged between the auxiliary winding and the first device edge, and the second transistor is arranged between the auxiliary winding and the second device edge of the device.

In preferred embodiments, the first transistor and the second transistor are arranged to substantially overlap the respective second and third conductive traces and vias defining the primary winding.

In preferred embodiments, at least one of the primary winding, the auxiliary winding, and the secondary winding are provided with a center tap terminal.

In preferred embodiments, the first and second opposing surfaces of the device not defining the conductive traces or vias are covered with a conductive plate.

In preferred embodiments, the substrate includes a toroidal or circular cavity, and the plurality of conductive traces and vias are arranged around the inner and outer peripheries of the cavity.

The device optionally includes a magnetic core embedded in the cavity.

In preferred embodiments, the second and third plurality of conductive traces and vias defining the primary winding are arranged in separate regions of the device.

In preferred embodiments, the second and third plurality of conductive traces and vias defining the primary winding are bifilar with respect to each other.

In preferred embodiments, the surface mounted first transistor and second transformers include respective first and second component housings arranged at 90 degrees to each other.

Further, the magnetic core may include a first section and a second section, the primary and the auxiliary windings surround the first section, and the secondary winding surround the second section.

In preferred embodiments, the first transistor is operable to energize the second plurality of conductive traces, and the second transistor is operable to energize the third plurality of conductive traces, and wherein in operation the second and third plurality of conductive traces and vias are energized alternately.

In preferred embodiments, a fourth plurality of conductive traces and vias define the secondary winding on the secondary side, and the conductive traces of the secondary winding are wider than those of the primary winding.

In preferred embodiments, the embedded magnetic component transformer device is a self-oscillating push-pull circuit.

Preferred embodiments of the invention therefore efficiently utilize the available space on the PCB and circuit board, meaning that performance can be enhanced without the need for additional copper traces, an increased PCB surface area, or enhanced cooling arrangements, such as additional heatsinks, or forced air cooling.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the invention include an embedded magnetic component transformer device including electrical windings disposed around a magnetic core embedded in an insulating substrate, together with transistors to energize the windings. The embedded magnetic component transformer device may advantageously be used as a portion of a switching power electronic device, such as a self-oscillating push-pull (Royer) circuit, and so may be used to convert a DC input voltage to a DC output voltage. Such a preferred embodiment will be discussed in relation to FIG. 1, in order to illustrate the general application of the embedded transformer device to power electronics. The details of the transformer device itself will be discussed in relation to subsequent preferred embodiments.

Figure 1:
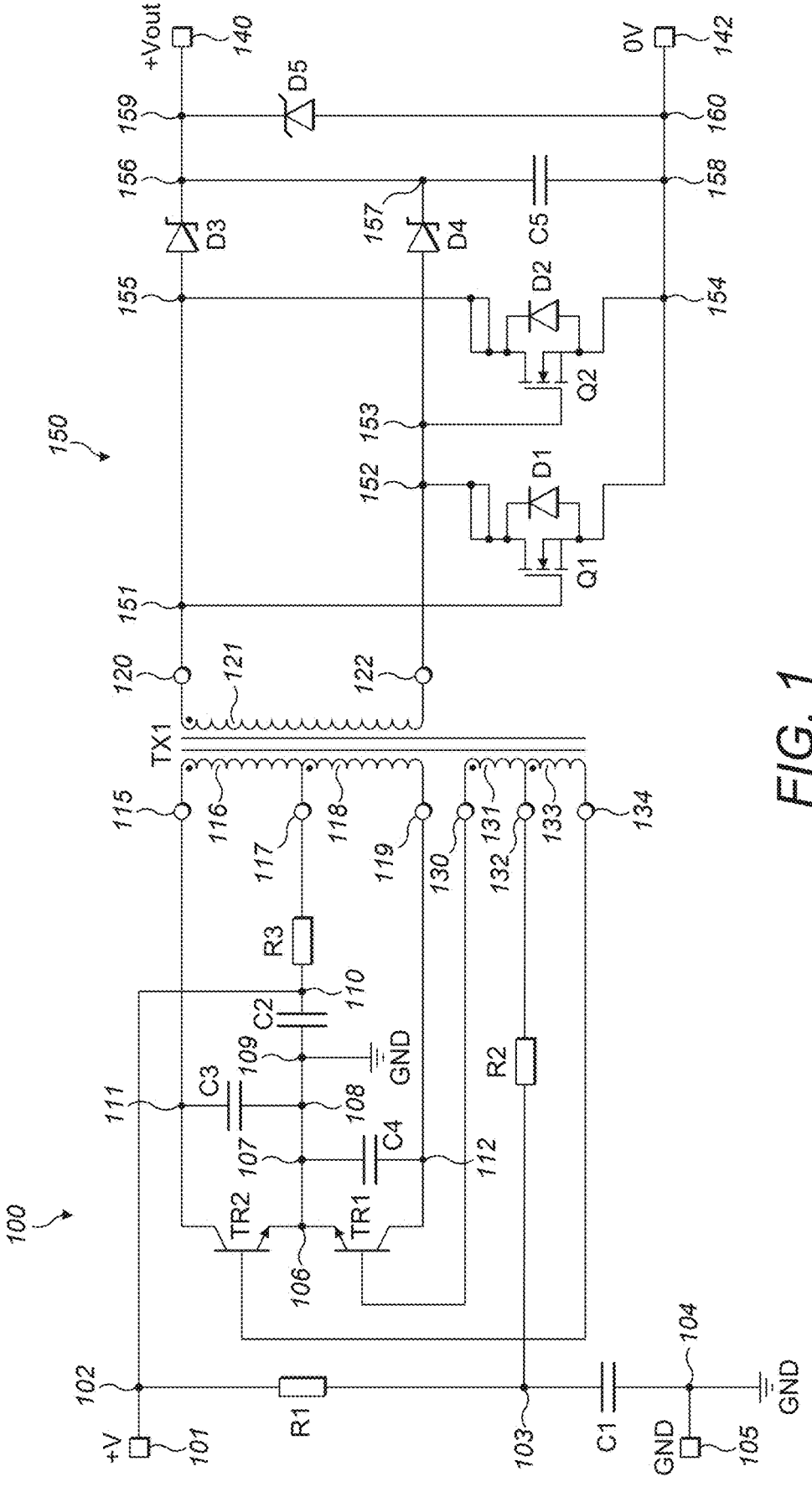
FIG. 1 illustrates an example preferred embodiment of the present invention in which an embedded transformer device defines a portion of a self-oscillating push-pull circuit.

However, the general principles of the invention are not limited to the device of FIG. 1, and so may be applied to other transformer and/or power supply configurations, not just self-oscillating push-pull circuits.

FIG. 1 is a circuit diagram including an embedded transformer device TX1, and a Royer circuit 100 located on the input side of the transformer TX1. The output side of the circuit is shown here as a synchronized rectifier circuit 150, but in other preferred embodiments could include a different configuration.

The Royer circuit 100 receives a DC input between a +V input terminal 101 and GND input terminal 105, with the GND terminal being held at a ground potential. A resistor R1 and capacitor C1 are connected in series across the input terminals 101, 105. Resistor R1 is connected between nodes 102 and 103, and capacitor C1 is connected between nodes 103 and 104. Node 102 is connected to the +V input terminal 101 and node 104 is connected to the GND input terminal 105.

As will be explained later with respect to FIGS. 2 to 7, the transformer TX1 is an embedded magnetic component device including a first or primary electrical winding 116, 118 defined between nodes 115 and 119, a second or secondary electrical winding 121 defined between nodes 120 and 122, and an auxiliary winding 131, 133 defined between nodes 130 and 134. Node 117 is an intermediate node connected part way along the first electrical winding 116, 118, and node 132 is an intermediate node connected part way along the auxiliary winding, 131, 133. Nodes 117 and 132 therefore define tap terminals. In one example, the nodes 117 and 132 are connected to the midpoint of the respective windings, defining center-tap terminals. Thus, the first electrical winding is divided into two winding portions 116 and 118, and the auxiliary winding is divided into two auxiliary winding portions 131 and 133.

Two transistors, TR1 and TR2 are provided to switch in and switch out an energizing voltage across the two portions of the first electrical windings 118 and 116 respectively. The transistors TR1 and TR2 are shown as being of npn-type, but other types are possible. High power switching transistors, for example MOSFETs (metal oxide field effect transistors) are suitable.

The collector of transistor TR2 is connected to a first end of the first electrical winding at node 115, and the collector of transistor TR1 is connected to a second end of the first electrical winding at node 119. The emitter of transistor TR1 and the emitter of transistor TR2 are both connected to node 106. Node 106 is electrically connected to nodes 107, 108, and 109, all of which are held at ground potential as indicated by GND in FIG. 1.

A first terminal of capacitor C2 is connected to node 109, and the other terminal is connected to node 110 which is connected directly to the high voltage input +V at node 102. Between node 110 and node 117 a resistor R3 is provided. The other terminal of C2 is connected to ground. A capacitor C3 is provided between nodes 111 and 108, in parallel with transistor TR2, and a capacitor C4 is provided between nodes 107 and 112, in parallel with transistor TR1. Node 111 is connected to the first end 115 of first electrical winding and to the collector of transistor TR2, and node 112 is connected to the second end 119 of the first electrical winding and to the collector of transistor TR1.

Each end of the auxiliary winding 131 and 133 is connected to one of the bases of the transistors TR1 and TR2. Thus, node 130 is connected to the base of transistor TR1, and node 134 is connected to the base of transistor TR2. Intermediate node 132 is connected the first terminal of a resistor R2, the second terminal of which is connected to node 103.

The input side circuit 100 oscillates between energizing the winding portion 116 and energizing the winding portion 118. When winding portion 118 is energized, the increasing magnetic flux passing through the core of transformer TX1 induces a voltage across the auxiliary winding portions 131 and 133. The induced voltage across auxiliary winding portion 131 is of the correct polarity to apply a voltage to the base terminal of transistor TR1 in order to keep transistor TR1 switched ON. A positive feedback arrangement is thereby achieved, with the transistor TR1 being switched ON and with the transistor TR2 being switched OFF. Eventually the magnetic field within the transformer core saturates, and the rate of change of magnetic flux within the transformer core drops to zero. The voltage across the first electrical winding portion 118, and therefore the current through the first electrical winding portion 118, also drops to zero. The auxiliary windings 131 and 133 react to this change, and an induced voltage, of reverse polarity, is set up across the auxiliary windings 131 and 133. This arrangement has the effect of switching ON transistor 2 and switching OFF transistor TR1, thereby energizing the winding portion 116. Again, positive feedback is set up such that the voltage applied to the base of transistor TR2 by the auxiliary winding portion 133 maintains transistor TR2 in a switched ON state, whilst keeping transistor TR1 in a switched OFF state. Following this, the magnetic field within the transformer core saturates, and the circuit returns to energizing the winding portion 118. This oscillatory behavior, alternating between energizing the first electrical winding portions 118 and 116, continues indefinitely as long as input power is provided to the input terminals 101 and 105.

In this example, the output side of the transformer takes the form of a synchronized rectifier circuit 150, including first and second transistors Q1 and Q2, connected between first and second output terminals +Vout (140) and 0V (142). In FIG. 1, although the two transistors Q1 and Q2 are illustrated as inductive channel MOSFETs, any other suitable transistor technology may be used. Diode D1 is connected across transistor Q1, allowing current to flow from node 154 to node 152. Diode D2 is connected across transistor Q2, allowing current to flow from node 154 to node 155.

On the output side of the transformer TX1, a second electrical winding 121 is provided between nodes 120 and 122. Node 120 connects via nodes 151 and 155 to forward biased diode D3, which is in turn connected via nodes 156 and 159 to the +Vout output terminal 140. In this case, the +Vout output terminal 140 is a positive output terminal. Further, node 122 connects via nodes 152 and 153 to a further forward biased diode D4, which is in turn connected via nodes 157, 156, and 159 to the +Vout output terminal 140. Although diodes D3 and D4 are shown in FIG. 1 as Schottky diodes, normal rectifier diodes could equally well be used.

Node 151, located in between node 120 and the input of the diode D3, connects node 120 to the gate terminal of transistor Q1. Node 153, located in between node 122 and diode D4, connects node 122 to the gate terminal of transistor Q2. The drain terminal of transistor Q1 is connected to node 152 located in between the node 122 and diode D4. The drain terminal of transistor Q2 is connected to node 155 located in between the node 120 and the diode D3. The source terminals of the transistors Q1 and Q2 are both connected to node 154, which in turn is connected via nodes 158 and 160 to the 0V output terminal 142.

Capacitor C5 is connected across the +Vout and 0V output terminals 140 and 142. A first capacitor terminal is connected to node 157, between the output of diode D4 and the +Vout output terminal 140, while a second capacitor terminal is connected to node 158, between the 0V output terminal 142 and the source terminals of transistors Q1 and Q2. Node 157 is connected to node 156, which is between diode D3 and the +Vout output terminal 140. Reverse biased Zener diode D5 is also connected across the output terminals, including one terminal connected to node 159 coupled to the +Vout output terminal 140, and the other terminal connected to node 160 coupled to the 0V output terminal 142.

The second electrical winding 121 has a voltage induced across it according to the rate of change of magnetic flux within the core of transformer TX1. An alternating current is therefore set up in the second electrical winding.

In a first mode of operation, the alternating current circulates in a first direction, though diode D3 which is forward biased, and via node 151 into the gate terminal of transistor Q1 turning it ON. When the transistor Q1 is ON, current flows through the transistor Q1 from source to drain, and current flows in the winding 121 from the second node 122 to the first node 120 and to the +Vout output terminal 140 via diode D3. A positive voltage is therefore established between output terminals +Vout (140) and 0V (142). In this mode of operation, reverse biased diode D4 prevents current flowing into the gate terminal of the second transistor Q2, which remains turned OFF.

In a second mode of operation, the alternating current circulates in a second direction, though diode D4, which is now forward biased, and via node 153 into the gate terminal of transistor Q2 turning it ON. When the transistor Q2 is ON, current flows through the transistor Q2 from source to drain, and current flows in the winding 121 from node 120 to node 122 and to the +Vout output terminal 140 via diode D4. A positive voltage is therefore also established between output terminals +Vout (140) and 0V (142), as with the first mode of operation.

As the magnetic flux in the transformer changes, the magnitude and direction of the alternating current in the output circuit changes. The diodes D3 and D4 thereby rectify the alternating current, so that the output provided to the terminals is always in the form of a positive voltage signal.

The capacitor C5 smooths the output voltage signal to provide an approximately constant direct current between the output terminals 140 and 142. Diode D5 may also be connected across the output terminals, in order to limit the gate voltage at the transistors Q1 and Q2 to a specific range dependent on the value of the diode. A resistance may be used in place of the diode D5 as a dummy load. The circuit illustrated in FIG. 1 therefore forms an isolated DC to DC convertor, taking a DC input across the +V and GND input terminals 101 and 105, and generating a DC output across the +Vout and 0V output terminals 140 and 142. As will be appreciated by the skilled person, the voltage of the DC output relative to that of the DC input can be adjusted by varying the number of turns on the first 116, 118 and second 121 windings.

The circuit shown in FIG. 1 is merely an example provided in order to understand the operation of the invention. The invention is not limited to this. In other examples, it is possible to provide simplified or alternative configurations for the input 100 and output stages 150.

Comparative Example 1

A first comparative example will now be described with reference to FIGS. 2 to 4.

Figure 2:
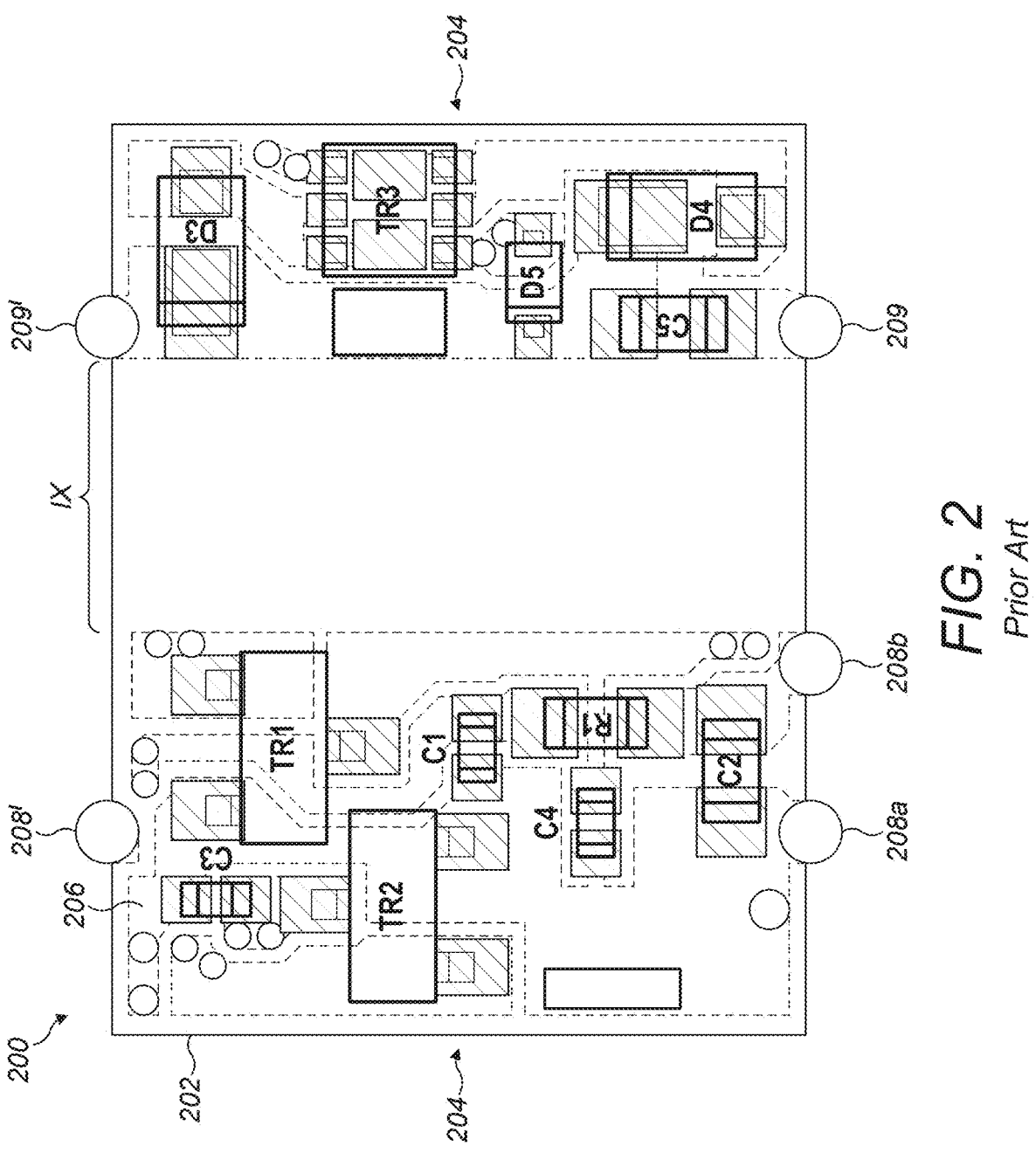
FIG. 2 illustrates a top elevation view of a first example prior art embedded transformer device including surface mounted components.

FIG. 2 shows a top view of an embedded magnetic component transformer device 200. Techniques for manufacturing an embedded magnetic component transformer device are described in UK patent applications GB2529235A and GB2528990A filed by the present applicant, which are incorporated herein by reference.

Figure 3:
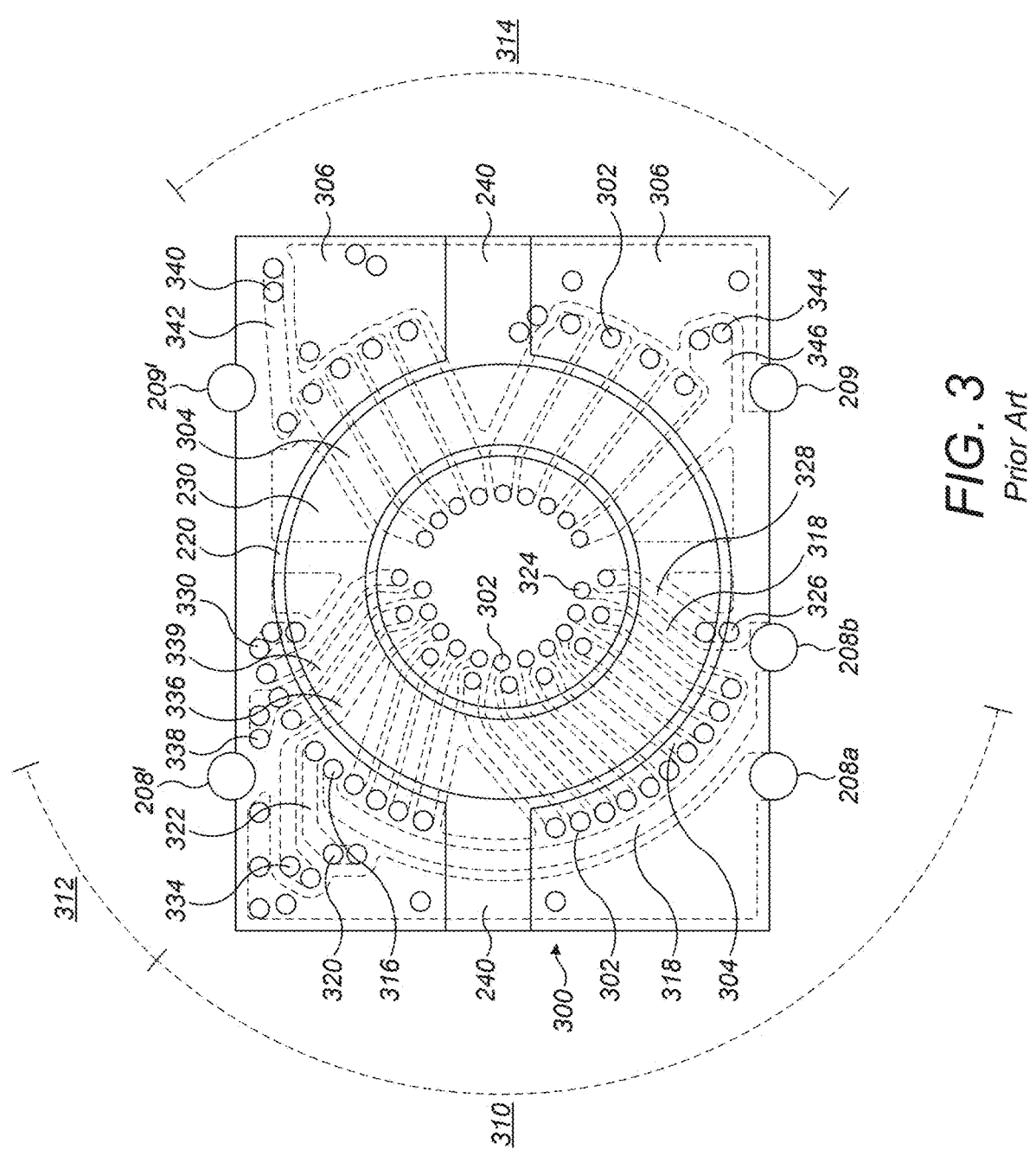
FIG. 3 illustrates a printed circuit board (PCB) layout for the embedded transformer device of FIG. 2 on a first side of the device.
Figure 4:
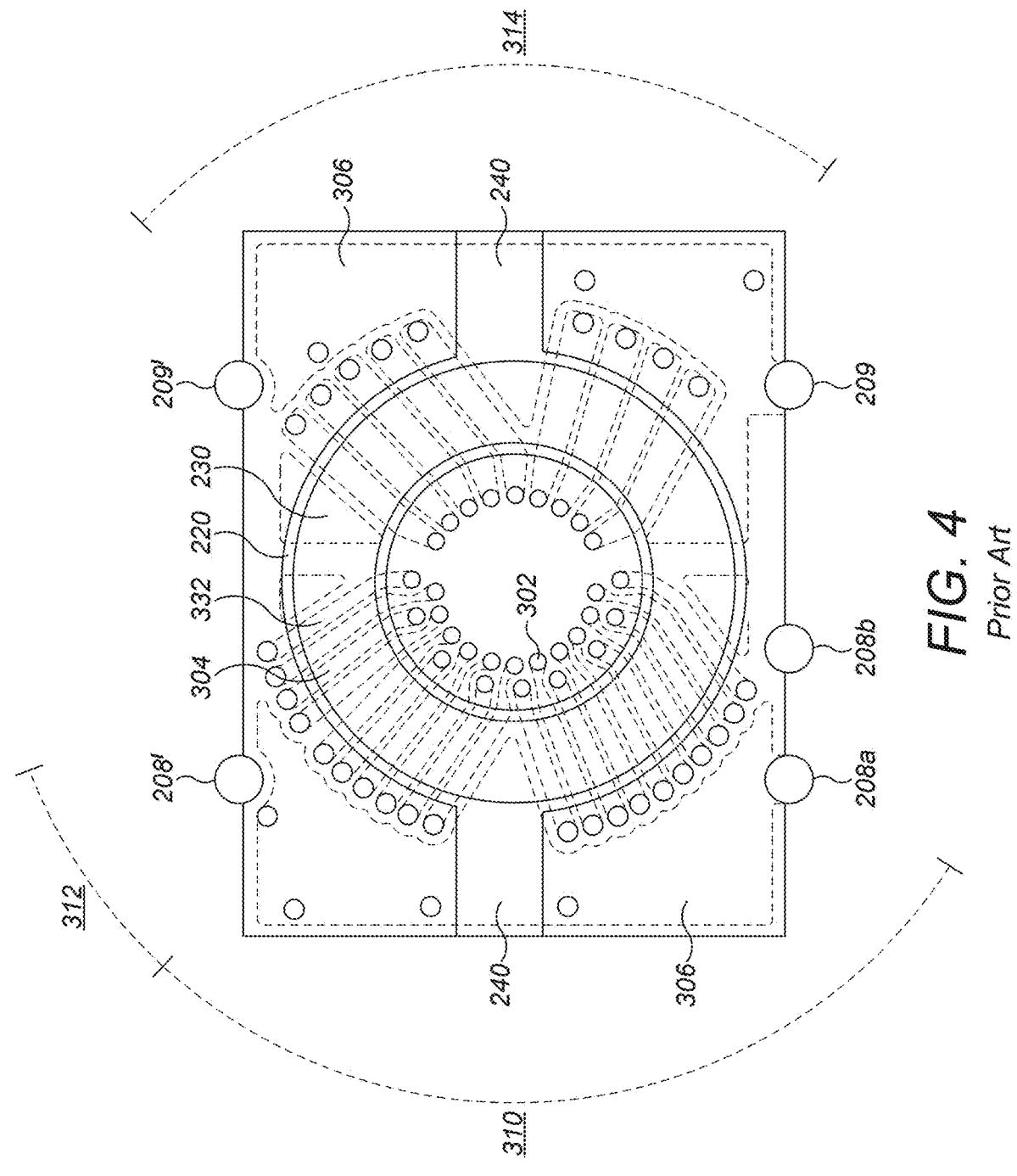
FIG. 4 illustrates a PCB layout for the embedded transformer device of FIG. 2 on a second opposing side of the device.

FIG. 3 illustrates a printed circuit board layout for the embedded transformer device of FIG. 2 positioned on a first side of the device; while FIG. 4 illustrates a printed circuit board layout for the embedded transformer device of FIG. 2 disposed on a second opposing side of the device. The first and second opposing sides of the device are arranged in the thickness direction of substrate, which in FIGS. 2 to 4, is shown as the direction into or out of the page.

The device shown in FIGS. 2 to 4 is an example implementation of the circuit diagram shown in FIG. 1. The diagram is intended to be schematic and not all of the separate components of FIG. 1 are necessarily shown in FIG. 2.

Referring to FIG. 2, the embedded magnetic component transformer device 200 includes a resin substrate 202, defining a device body, on which are mounted a number of surface-mounted electronic components 204. The electronic components 204 are supported on a printed circuit board 206 (only partially visible in FIG. 2, but illustrated more clearly in FIGS. 3 and 4) formed on the top of the resin substrate 202. Edge castellations 208a, 208b, 208', 209 and 209', conductive plated holes in the edge of the resin substrate 202, are provided on the top and bottom side edges of the device to provide connections that provide power to the embedded and surface mounted circuits, and/or that allow signals to be input/output to the device. Referring to FIGS. 2 to 4, the terms top and bottom are used for explanation to refer to the view of the first and second opposing surfaces of the device arranged in the thickness direction of the substrate. The terms top and bottom edge or sides of the device are used also to describe the position of the edge castellations. In this regard, the terms top and bottom edges are understood as they appear on the page, the top edge being the edge of the device shown towards the upper side of the page, and the bottom edge of the device being the edge of the device shown towards the bottom of the page.

As shown in FIG. 2, on an input or primary side of the device (the left hand side of FIG. 2 for example), the embedded magnetic component transformer device includes a number of surface mounted components, such as first and second transistors TR1 and TR2, capacitors C1 to C4, and resistor R1. The output or secondary side of the device (the right hand side of FIG. 2) is separated from the input side by an isolation region IX, and can be seen to include transistor TR3, diodes D3, D4 and D5, and capacitor C5. Power connections, or other input/output connections can be made to the device via edge castellations 208a, 208b, 208', 209 and 209'.

In this example, the pair of edge castellations 208a and 208b at the bottom of the resin substrate are used to provide power to the input side of the device (for example by connection to a +V power supply line and a ground connection as shown in FIG. 1), while castellation 208' is not used. Referring to FIG. 2, the edge castellations 208a and 208b can be seen connecting directly to capacitor C2 via surface conductive tracks. On the output side edge castellations 209 and 209' provide output locations for the output signal. 209' is the positive signal output, while 209 can be an earth or ground connection.

Edge castellations are used in the design as they provide a number of advantages for manufacture and circuit design. They are typically formed as via holes in a substrate that are plated before the substrate is split, along the via holes, forming an edge to the device. For this reason, a device may include more edge castellations than are actually put to use. Although, edge castellations are shown in this example, SMD (surface mounting device) pins or wiring or other techniques for connecting power to the circuit may be used.

It will be appreciated that FIG. 2 is illustrative of a known device and that in other devices, different surface mounted components may be included instead of those shown here.

FIG. 2 shows only one side, a first or top surface, of the embedded transformer device, and a corresponding diagram of the second of opposing side has been omitted. It will be appreciated that the second or opposing side of the device may also include a number of electronic components, depending on the desired function of the device, and the desired device profile.

In this example, the device 200 of FIG. 2 is understood to be a cuboid, with a rectangular sides of comparable but different length, extending in the width and length directions (x and y directions corresponding to the plane of the page), and a smaller height dimension (the z direction out of the plane of the page) extending into or out of the page. The body of the device may be made from an insulating substrate 202 of resin material, such as FR4, including an interior cavity 220 in which a transformer core 230 is installed (this is not visible in FIG. 2 but is shown in FIG. 3). FR4 is a composite pre-preg material composed of woven fiberglass cloth impregnated with an epoxy resin binder. The resin is pre-dried, but not hardened, so that when it is heated, it flows and acts as an adhesive for the fiberglass material. FR4 has been found to have favorable thermal and insulation properties. In alternative preferred embodiments, different materials may be used for the substrate.

A conductive substance, such as copper, is deposited onto the first and second opposing surfaces of the device 200 to provide first and second surface mounted PCBs 206 and a surface for surface mounting additional electronic components 204.

FIGS. 3 and 4 show the surface conductive traces or tracks 300 provided on the first and second surfaces of the embedded transformer device 200. Also visible in FIGS. 3 and 4 is the interior profile of the device, including a circular or toroidal internal cavity 220 housing a magnetic transformer core 230. The core 230 may be made of a suitable ferrite material. In other preferred embodiments, an air core is also possible. Optional access channels 240 connect the internal cavity to the outside of the device, advantageously providing ventilation passages that assist with cooling the device during manufacture or operation, as well as ease of manufacture if the internal cavity 240 is manufactured by routing with a drill bit.

A plurality of conductive vias or through holes 302 are provided in the resin substrate 202 around the periphery of the circular or toroidal cavity 220. The conductive vias 302 are connected by conductive traces 304 (shown in dashed lines) on the first and second opposing surfaces of the embedded device 202, such that transformer windings 310, 312 and 314, surrounding the magnetic core 230, are formed from the conductive vias 302 and traces 304. Electrical signals can be input and output to the windings by surface features in the copper connected to an initial or final conductive via, and one or more surface mounted electrical components (not shown in FIGS. 3 and 4), or to edge castellations 208a, 208b and 209 and 209'. Regions of the surface without traces 306 retain the copper plating to be used as heatsinks or ground plates.

The windings in FIGS. 3 and 4 are arranged into a pair of primary windings 310, and an auxiliary winding 312 on the input side, and a secondary winding 314 on the output side. In this example, the auxiliary winding 312 is positioned towards the top edge of the device, between the isolation region IX and the start of the primary winding 310. The primary winding 310, stretches from the top of the device to the bottom of the device around the magnetic core 230.

In this example, the two winding portions of the primary 310 (corresponding to sections 116 and 118 in FIG. 1) are wound in a bifilar or interleaved arrangement. The center tap stretches 318 from the start of the primary winding 310 to the finish of the primary winding 310 at the bottom of the PCB (near the castellation 208b). In FIG. 3, the center tap 318 is formed by conductive via 316 and conductive surface trace 318. The pair of winding portions of the primary winding 310 stretch across the channels 240 between their end/start sections of the windings. The first portion of the primary winding 310 begins at conductive via 320 and conductive trace 322 and ends at the conductive via 324 at the bottom of the PCB connected in turn to conductive trace 318 forming a portion of the center tap. The second portion of the primary winding 310 in turn begins at the center tap terminal 316 and ends at the conductive via 326 and trace 328.

The auxiliary coil is similarly formed between the conductive via 330 and trace 332 (shown in FIG. 4 on the reverse side of the device) and the conductive via 334 and trace 336, with the auxiliary center tap being formed by conductive via 338 connected to trace 339. In preferred embodiments, such when the embedded transformer is used as a portion of the circuit illustrated in FIG. 1, the voltage across the auxiliary winding 312 is fed back to the input circuitry being used to energize the first winding 310, the auxiliary winding acting as a feedback winding.

Alternatively or additionally, the auxiliary winding 312 can be used to control some other aspect of the input and/or output circuitry. Other uses of the auxiliary winding could be to provide a housekeeping supply or to control a synchronous rectifier. More than one auxiliary winding could be provided, allowing more than one of these functions to be carried out. Other uses for the auxiliary windings are also possible. Furthermore, it is not always necessary to include an auxiliary winding. This will be the case, for example, if a synchronous rectifier is provided on the output side of the transformer, and the input side is independently controlled.

The secondary winding 314 on the output side is shown as including a smaller number of turns compared with those of the primary windings. Additionally, the copper traces 304 making up the winding 314 are illustrated as including a greater width. The secondary coil is formed between the conductive via 340 and trace 342 and the conductive via 344 and trace 346, and similarly spans the optional channel 240.

In alternative examples, different numbers of windings or number of turns may be included. As will be appreciated by the skilled person, when the transformer is in operation the ratio of the voltages provided across the first, second, and auxiliary windings is proportional to the number of turns in each respective winding. Therefore, the number of turns in each winding can be chosen, by adding or removing conductive vias 302 and conductive traces 304, in order to obtain desirable voltage ratios between the windings. This is particularly important in, for example, isolated DC-to-DC converters where strict requirements as to the output voltage will typically need to be met.

It will be appreciated from the above discussion that the design of the PCB is important both in terms of the functionality to be provided by the device, but also in terms of the optimal usage of space on the PCB. An optimal design means that the PCB can be made smaller, or that more functionality can be provided in the same space.

The example of FIGS. 3 and 4 discussed above include a number of topographical features that characterize the device. Specifically, the two primary windings are wound bifilar across the width of the device, from the top edge of the PCB (shown at the top of the page) to the bottom edge, and the center tap trace stretches from the start of the first primary winding at the top edge of the PCB to the end of the second primary winding at the bottom of the PCB. The feedback windings are also placed at the top of the PCB.

Since the primary windings are stretched across the PCB, there is no ideal position to place transistors TR1 and TR2 on the surface. A close balanced connection from the feedback windings to the transistors is desirable, and this forces the transistors TR1 and TR2 to be located as shown in FIG. 2 at the top edge of the PCB. On the other hand, the power pins enter at the bottom of the PCB via castellations 208a and 208b. The result is a complex criss-crossing of tracks which cut through any large copper planes of the PCB which could be used as heatsink areas, and which add unnecessary tracking losses and leakage inductance.

Transistors TR1 and TR2 energize the first and second portions of the first electrical winding, as explained in relation to the preferred embodiment of FIG. 1. When used with power converter circuitry, and in particular a self-oscillating push-pull (Royer) circuit configuration as illustrated in FIG. 1, the transistors TR1 and TR2 act to alternately energize the first and second winding portions of the first electrical winding. There will be losses in the transistors TR1 and TR2, and since they are both at the top of the PCB away from the power pins, the top of the PCB will get hot in this area only.

Second Comparative Example

Figure 5:
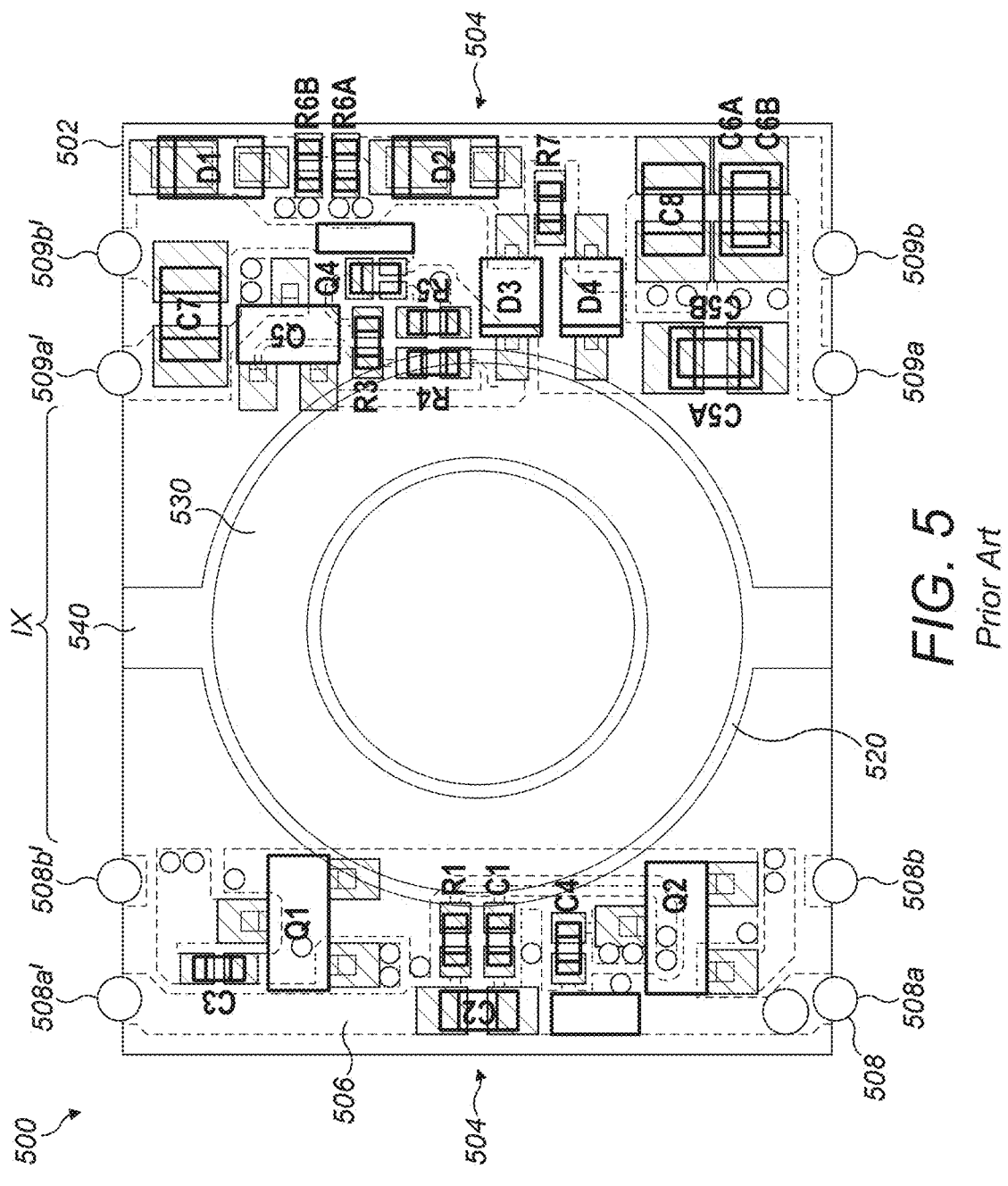
FIG. 5 illustrates a top elevation view of a second example prior art embedded transformer device including surface mounted components.
Figure 6:
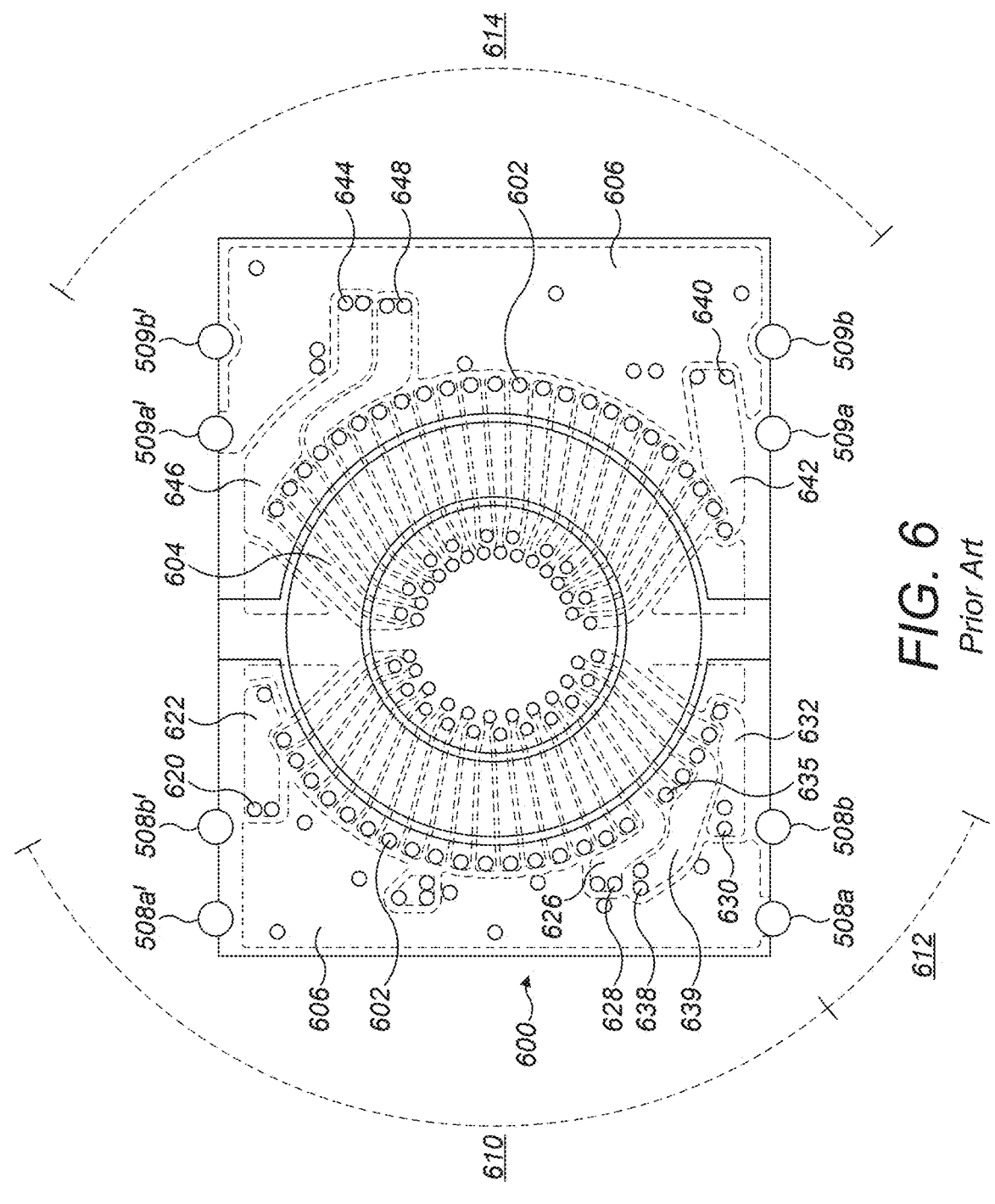
FIG. 6 illustrates a PCB layout for the embedded transformer device of FIG. 5 on a first side of the device.
Figure 7:
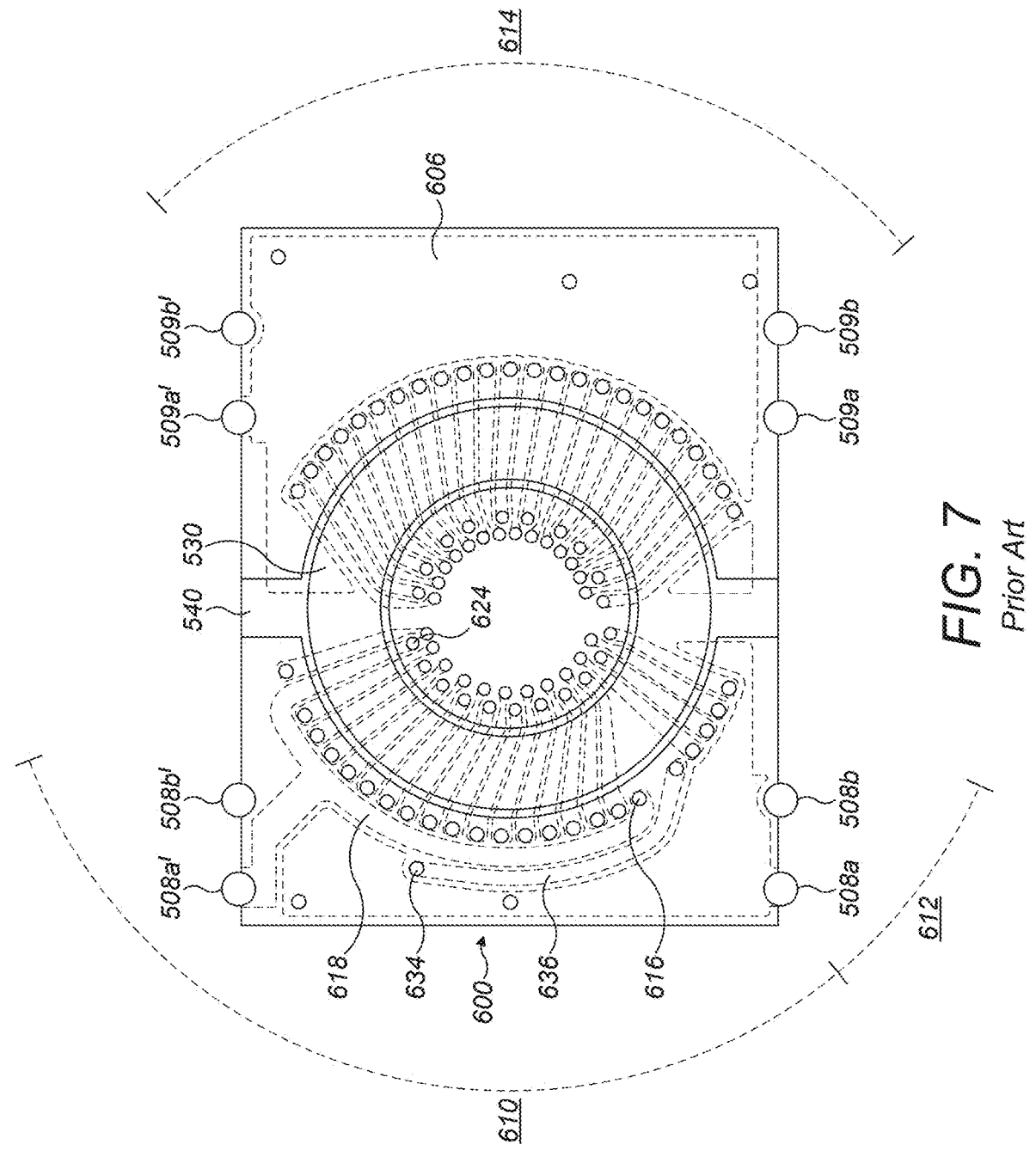
FIG. 7 illustrates a PCB layout for the embedded transformer device of FIG. 5 on a second opposing side of the device.

A second comparative example will now be described with reference to FIGS. 5 to 7. FIG. 5 shows a top view of a second embedded transformer device 500. FIG. 6 illustrates a printed circuit board layout for the embedded transformer device of FIG. 5 on a first or top side of the device; while FIG. 7 illustrates a printed circuit board layout for the embedded transformer device of FIG. 5 on a second or bottom opposing side of the device. The device shown in FIGS. 5 to 7 is a further example implementation of the circuit diagram shown in FIG. 1. To the extent that FIGS. 5 to 7 show or illustrate the same concepts as FIGS. 2 to 4 further discussion will be omitted.

The embedded magnetic component transformer device 500 includes a resin substrate 502, forming a device body, on which are mounted a number of surface-mounted electronic components 504. The electronic components 504 are supported on a printed circuit board 506 (only partially visible in FIG. 5, but illustrated more clearly in FIGS. 6 and 7) formed on the top of the resin substrate 502. Edge castellations 508a, 508b, 508a', 508b', 509a, 509b, 509a' and 509b', conductive plated holes in the edge of the resin substrate 502, are provided on the side edges of the device to provide connections that provide power to the embedded and surface mounted circuits, and/or that allow signals to be input/output to the device.

Also visible in FIG. 5, purely for illustration, is the interior profile of the device, including a circular or toroidal internal cavity 520 housing a magnetic transformer core 530. The core 530 may be made of a suitable ferrite material. Optional access channels 540 connect the internal cavity to the outside of the device, advantageously providing ventilation passages that assist with cooling the device during manufacture or operation, as well as ease of manufacture if the internal cavity 540 is manufactured by routing with a drill bit. In this example, the access channels emerge from the cavity 520 along the longer edges of the device.

As shown in FIG. 5, the second comparative example includes an alternative arrangement of electronic components, including first and second transistors Q1 and Q2, capacitors C1 to C4, resistor R1. The secondary or output side of the device is separated from the input side by an isolation region IX, and can be seen to include further transistors Q4, 05, resistors R3 to R7, capacitors C5 to C8, and diodes D1 to D4. Power connections, or other input/output connections, can be made to the device via edge castellations 508a, 508b, 509a, 509b, 508a', 508b', 509a', and 509b'.

Referring to FIG. 6, the primary winding 610 can be seen stretching from the top of the PCB to the bottom with the feedback winding 612 positioned between the isolation region IX and the end of the primary at the bottom of the device 500.

The secondary side winding 614 includes a larger number of narrower turns compared to the first comparative example and stretches from the top of the device to the bottom.

In this example, the two winding portions of the primary 610 (corresponding to sections 116 and 118 in FIG. 1) are wound in a bifilar or interleaved arrangement. As shown in FIG. 7, in this example the center tap 618 stretches from the start of the primary winding 610 at the top of the PCB to the finish of the primary winding 610 at the bottom of the PCB (near the castellation 508b). In FIG. 7, the center tap 618 is formed by conductive via 616 and conductive surface trace 618.

The first portion of the primary winding begins at conductive via 620 and conductive trace 622 and ends at the conductive via 616 (FIG. 7) for the center tap at the bottom of the PCB. The second portion of the primary winding in turn begins at the center tap terminal 616, and connected via 624, and ends at the conductive via 628 and trace 626.

The auxiliary coil 612 is similarly formed between the conductive via 630 and trace 632 (FIG. 6) and the conductive via 634 and trace 636 (shown in FIG. 7 on the reverse side of the device), with the auxiliary center tap being formed by conductive via 638 connected to trace 639 (FIG. 6). In preferred embodiments, such when the embedded transformer is used as a portion of the circuit illustrated in FIG. 1, the voltage across the auxiliary winding 612 is fed back to the input circuitry being used to energize the first winding 610, the auxiliary winding acting as a feedback winding.

The secondary winding 614 on the output side is formed between the conductive via 640 and trace 642 and the conductive via 644 and trace 646. An optional tap 648 is provided on the secondary side to change the number of output turns and provided a second or dual output.

In this example, the pair of edge castellations 508a' and 508a at the top and the bottom of the resin substrate are used to bring power into the input side of the device (for example by connection to a +V power supply line and a ground connection as shown in FIG. 1). Referring to FIG. 5, the edge castellations 508a and 508a' can be seen connecting directly to capacitor C2 via surface conductive tracks. Castellations 508b and 508b' are not used in this example, but may be present in the substrate as a feature of manufacture.

On the output side edge castellations 509a, 509b, 509a' and 509b' provide output signals connection. Edge connections 509a' and 509a provide a first signal output from the output stage of the transformer, while edge connections 509b' and 509b provide a second or dual signal output. In this way, output signals with different signs, or with different magnitudes may be output.

A significant difference compared with the first comparative example is that in the second example, the two input side transistors Q1 and Q2 are located roughly symmetrically across the width of the PCB on the input side at both the top and bottom of the device, and power is received at the top and bottom of the device. This spreads the heat generated by the transistors more evenly across the PCB than in the first example. However, the feedback windings are now placed at the bottom of the PCB placing them close to one transistor but not the other. As a result, in this example, there is still a complex criss-crossing of tracks which cut through any large copper heatsink areas, and additional tracking losses and leakage inductance.

First Preferred Embodiment

Figure 8:
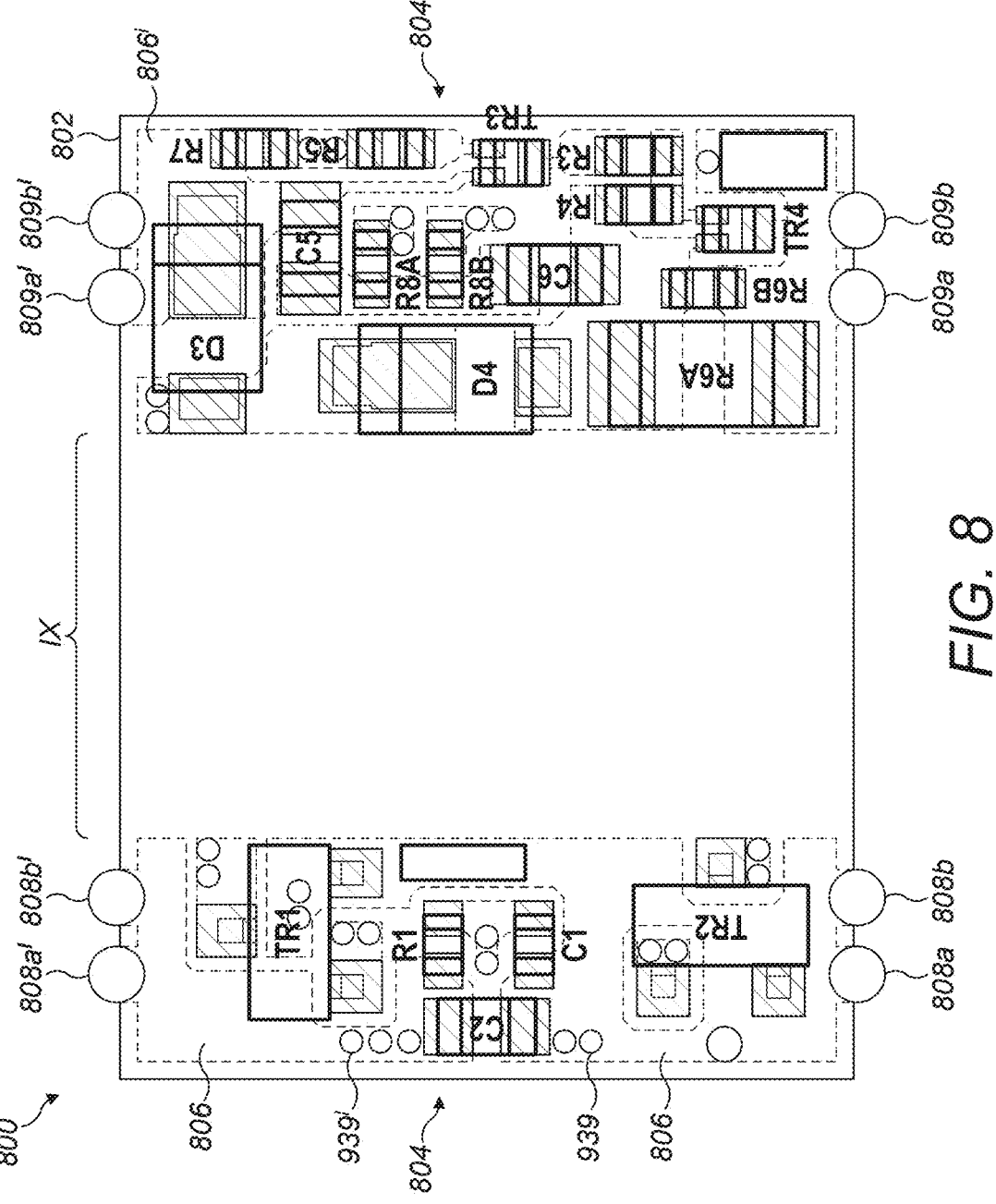
FIG. 8 illustrates a first example arrangement for an embedded transformer device including a PCB layout according to a preferred embodiment of the present invention.
Figure 9:
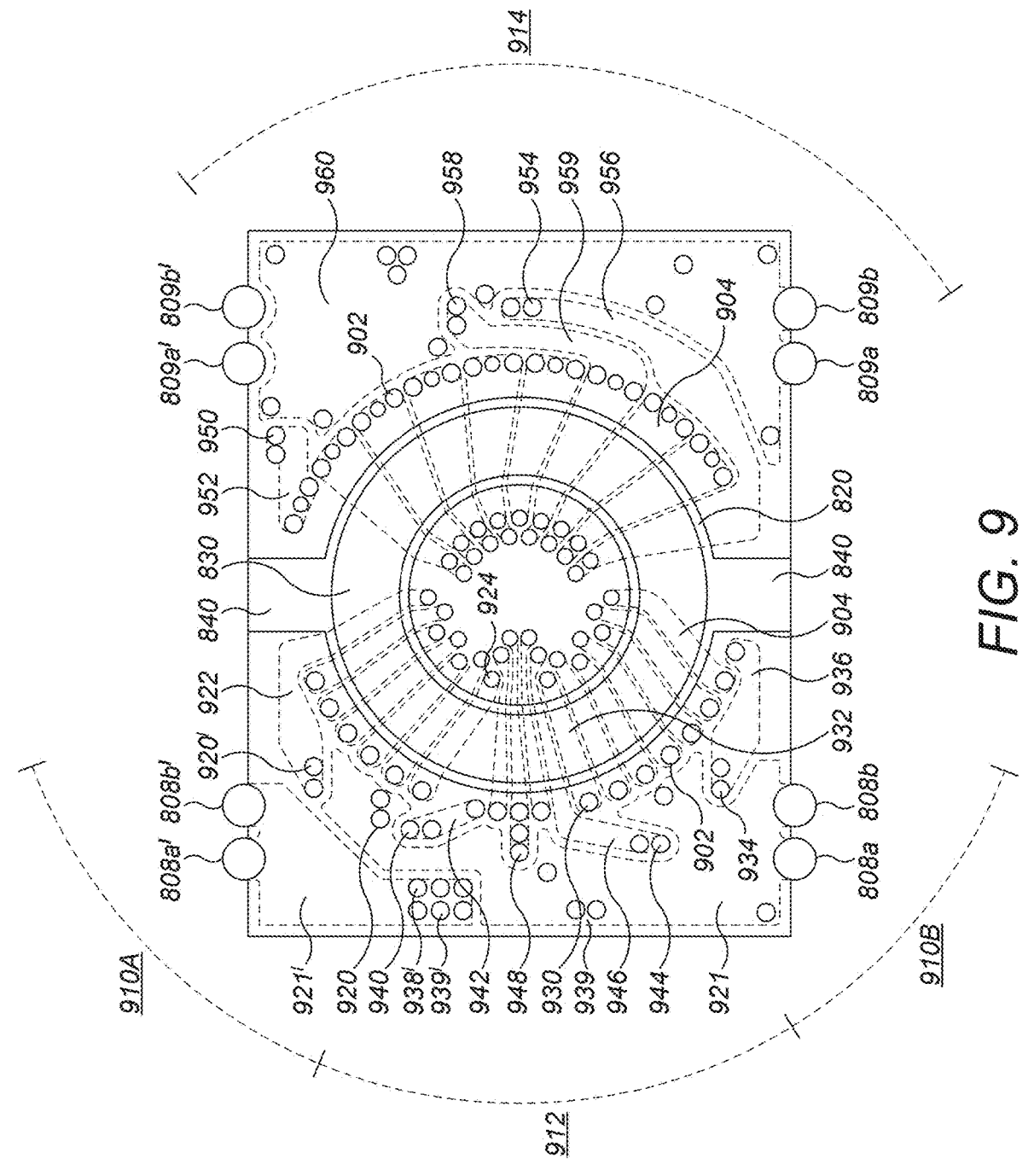
FIG. 9 illustrates a PCB layout for a preferred embodiment of the embedded transformer device of FIG. 8 on a first side of the device.
Figure 10:
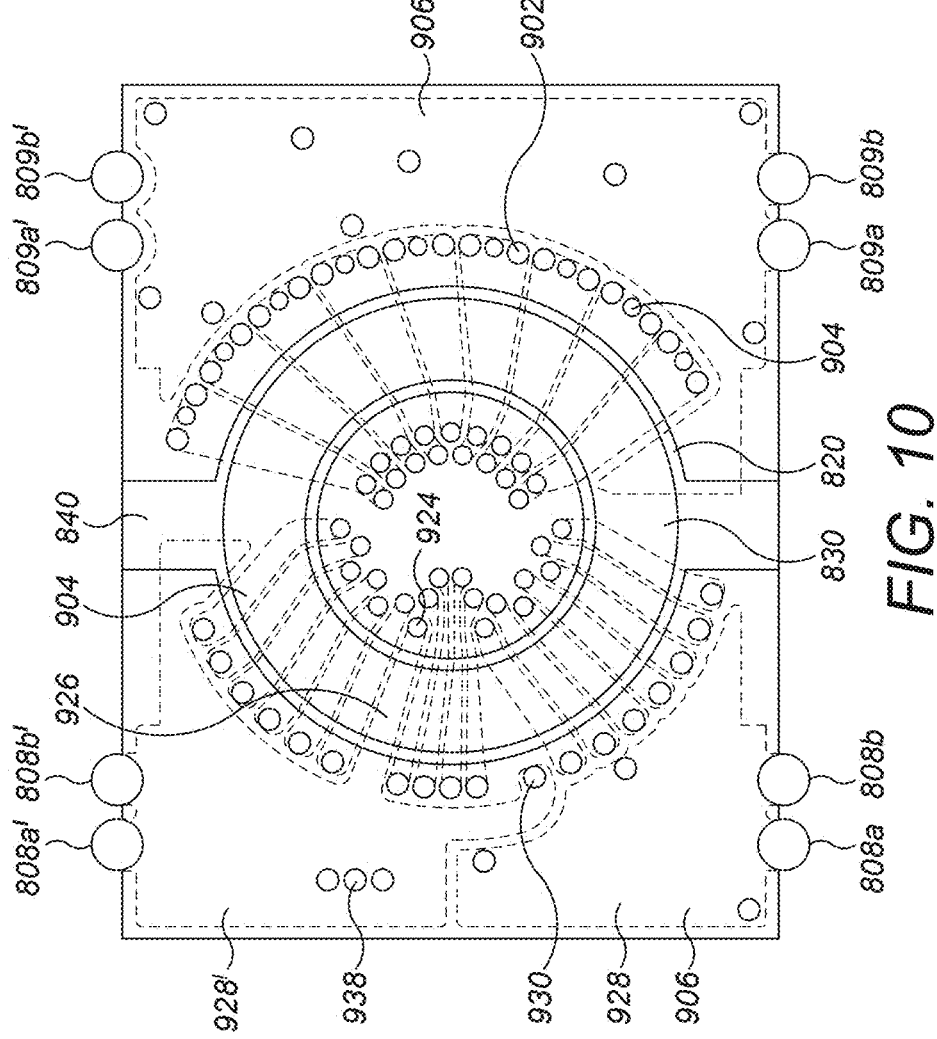
FIG. 10 illustrates a PCB layout for a preferred embodiment of the present invention of the embedded transformer device of FIG. 8 on a second side of the device.

Preferred embodiments of the invention will now be described with reference to FIGS. 8 to 12. FIG. 8 shows a top view of an embedded transformer device with a number of surface mounted electronic components according to a preferred embodiment of the invention. FIG. 9 illustrates a printed circuit board layout for the embedded transformer device of FIG. 8 on a top or first side of the device; while FIG. 10 illustrates a printed circuit board layout for the embedded transformer device of FIG. 8 on a second or bottom opposing side of the device. FIGS. 8, 9, and 10 therefore respectively show, by way of illustration, three different layers of printed circuit board of the device.

As before, the device shown in FIGS. 8 to 10 is an example implementation of a self-oscillating push-pull (Royer) circuit, such as that shown in FIG. 1. FIGS. 8 to 11 correspond to a slightly simplified arrangement in which resistors R2 and R3, and capacitors C2, C3, and C4 are omitted.

Referring to FIG. 8, the embedded magnetic component transformer device 800 according to a preferred embodiment of the invention includes a resin substrate 802, forming a device body, on which are mounted a number of surface-mounted electronic components 804. The electronic components 804 are supported on a printed circuit board 806 (only partially visible in FIG. 8, but illustrated more clearly in FIGS. 9 and 10) formed on the top of the resin substrate 802. Edge castellations 808*a*, 808*a'* 808*b*, 808*b'*, 809*a*, 809*a'*, 809*b*, and 809*b'*, conductive plated holes in the edge of the resin substrate 802, are provided on the side edges of the device to provide connections that provide power to the embedded and surface mounted circuits, and/or that allow signals to be input/output to the device. The printed circuit board and electronic components provide a first or upper layer of circuitry for the transformer device.

Apart from the differences explained below, the construction and configuration of the device in the first preferred embodiment will be understood to be the same as the comparative examples discussed above.

As shown in FIG. 8, the example of the preferred embodiment includes an alternative arrangement of electronic components, including first and second transistors TR1 and TR2, capacitors C1 and C2, and resistor R1. The output side of the device is separated from the input side by an isolation region IX, and can be seen to include transistors TR3 and TR4, diodes D3 and D4, capacitors C5 and C6, and resistors R3 to R8. Power connections, or other input/output connections can be made to the device via edge castellations 808*a*, 808*a'* 808*b*, 808*b'*, 809*a*, 809*a'*, 809*b*, and 809*b'*.

In this preferred embodiment, the inputs and output edge castellations are paired, to provide improved conductivity for the input and output connections. This improves thermal performance at the edge castellations of the device which could otherwise heat up. Referring to FIG. 8, input power connections (such as +V and −V, or +V and GND) are made at respective pairs of inputs 808*a* and 808*b*, and 808*a'* and 808*b'*. Castellations 808*a* and 808*b* can be seen to be connected to each other via surface mounted conductive tracks of printed circuit board 806 at the bottom of the device. Similarly, at the top side of the device castellations 808*a'* and 808*b'* are connected to each other device via separate surface mounted conductive tracks of printed circuit board 806. Power is received at the top and the bottom of the device, and is subsequently connected to input capacitor C2, and other components, by the tracks of the printed circuit board. As shown in FIG. 8, a number of conductive vias 939' are provided connecting the printed circuit board to lower conductive layers of the device. The conductive vias 939' act as the star point of the connecting the inputs 809*a*, 809*b* and 808*a'*, 808*b'* to the transistors TR1 and TR2. This will be discussed in more detail later.

On the output side of the device, edge castellations 808*a*, 809*b*, and 809*a'*, 809*b'* are connected to the output side printed circuit board 806', from which they are connected as appropriate to output side electronic components 804, including diodes D3 and D4, capacitors C5, C6, transistors TR3 and TR4, and resistors R3 to R8.

Similarly, on the output side of the device, castellations 809*a* and 809*b* can be seen to be connected to each other via surface mounted conductive tracks of the printed circuit board, at the bottom of the device, and at the top side of the device, castellations 809*a'* and 809*b'* are connected to each other device via separate surface mounted conductive tracks of the printed circuit board.

It will be appreciated that although the terms input and output are used here, this is purely for ease of description and in no way limits the type of signal that can be applied to the edge castellations 808*a*, 808*a'* 808*b*, 808*b'*, 809*a*, 809*a'*, 809*b*, and 809*b'*. In other preferred embodiments for example, input signals could be received at castellations 809*a*, 809*b*, 809*a'* and 809*b'* and be output by edge castellations 808*a*, 808*b*, 808*a'* and 808*b'*.

Similarly, the edge castellations are merely one way of making external connections to the device are not intended to be limiting. In alternative examples, other methods of connection such as SMD pins or wiring could be used.

As with the earlier comparative examples (and as visible in FIG. 9), the interior profile of the device includes a circular or toroidal internal cavity 820 housing a magnetic transformer core 830. The core 830 may be made of a suitable ferrite material. The core 830 may be made of a suitable ferrite material. In preferred embodiments, an air core is also possible. Optional access channels 840 connect the internal cavity to the outside of the device, advantageously providing ventilation passages that assist with cooling the device during manufacture or operation, as well as ease of manufacture if the internal cavity 840 is manufactured by routing with a drill bit. In this preferred embodiment, the access channels emerge from the cavity 820 along the longer edges of the device.

The PCB arrangement of conductive traces for this preferred embodiment is illustrated in more detail in FIGS. 9 and 10, which form middle and lower layers of circuitry compared with FIG. 8.

Referring to FIG. 9, conductive plate 921' connects edge castellations 808*a'* and 808*b'* to conductive vias 939', and serves to connect the printed circuit board 906 shown in FIG. 8 to the layer of circuitry shown in FIG. 9. Similarly, referring to FIG. 10, conductive plate 928' connects edge castellations 808*a'* and 808*b'* to conductive vias 938' which in turn connect the conductive plate 928' to the conductive plate 921' shown in FIG. 9. As can be seen from FIG. 10, conductive plate 928' acts to provide power to the primary winding 910 via a center tap terminal formed by conductive via 924 and trace 926.

Similarly, referring to FIG. 8, at the bottom of the device, edge castellations 808*a* and 808*b* are connected via conductive plate 921 to conductive vias 920 to input capacitor C2 and input transistor TR1. Conductive vias 939 connect the conductive plate to the upper layer of circuitry shown in FIG. 8. As before, the windings are arranged around the inner and outer periphery of the core 830 to form a primary winding 910A, 910B with a pair of winding portions meeting at a center tap 928', a feedback or auxiliary winding 912, and a secondary winding 914. The vias and traces which form the windings are generally given reference numbers 902 and 904 respectively.

The feedback winding or auxiliary 912 is formed by a first plurality of conductive traces and vias, provided in the center of the input or primary side circuit arrangement, with respect to the width dimension of the PCB, and/or the center position of the core, and in between the two portions of the primary winding. The first portion of the primary winding 910A is formed at the top quarter of the PCB, between the auxiliary winding 912 and the isolation region IX. The winding 910A is formed by a plurality of conductive vias and traces, illustrated as between conductive via 920 and trace 922, and the conductive via 924 and conductive trace 926. Conductive trace 926 is shown more clearly in FIG. 10 forming an end winding for the primary coil and terminating in the large conductive plate region 928'. The first portion of the primary winding 910A is therefore formed from a second plurality of conductive traces and vias, different to the first plurality forming the auxiliary winding 912.

Similarly, the second portion of the primary winding is formed at the bottom quarter of the PCB, between the auxiliary winding 912 and the isolation region IX. The winding is formed by a plurality of conductive vias and traces, illustrated as between conductive via 930 and trace 932 and the conductive via 934 and conductive trace 936. Referring to FIG. 10, it can be seen that the conductive via 930 signifying the beginning of the second portion of the primary winding is also connected to the center tap 928'. The second portion of the primary winding is therefore formed from a third plurality of conductive traces and vias, different to the first and second plurality.

Again referring to FIG. 9, the auxiliary winding 912 can be seen as formed between the two portions of the primary winding 910A and 910B. The auxiliary winding is formed by a plurality of conductive vias and traces, between conductive via 940 and trace 942 and the conductive via 944 and conductive trace 946, with the auxiliary center tap being formed by via 948 and the associated surface conductive trace.

The secondary winding 914 on the output or secondary side is shown as including a smaller number of turns compared with those of the primary windings. Additionally, the copper traces 904 making up the winding 914 are illustrated as including a greater width. In this context, it will be appreciated that the constraints on the conductive traces to fit around each other and engage with the appropriate conductive vias means that the traces do not always have a uniform width over their length between respect vias. Speaking of secondary windings that are wider than those of the primary refers to the average width of the respective windings on the primary and secondary sides taken as a whole.

As noted above, the input and output sides of the device are referred to as such, for ease of illustration and in other preferred embodiments the sense of the input and output connections could be reversed. Similarly, although wider connections on the output stage are shown in this preferred embodiment, and provide advantages such as increased conductivity (lower resistance) and flux linkage for the transformer, in other preferred embodiments, they could the same width or thinner compared to the input stage, or the windings on the input stage could be the wider traces shown here on the output side.

The secondary coil is formed between the conductive via 950 and trace 952 and the conductive via 954 and trace 956. A tap-off conductive via 958 and conductive trace 959 are also provided so that the transformer can be adapted in use to include an alternative number of windings. Adjacent the traces is a ground plate region 960 connecting to paired edge castellations 809a and 809b.

In alternative examples, different numbers of windings or number of turns may be included. As will be appreciated by the skilled person, when the transformer is in operation the ratio of the voltages provided across the first, second, and auxiliary windings is proportional to the number of turns in each respective winding. Therefore, the number of turns in each winding can be chosen, by adding or removing conductive vias 902 and conductive traces 904, in order to obtain desirable voltage ratios between the windings. This is particularly important in, for example, isolated DC-to-DC converters where strict requirements as to the output voltage will typically need to be met. Off-tap arrangements like that provided by vias 958 and traces 959 can also be used.

As can be clearly seen in FIG. 9, the preferred embodiment separates the input side primary windings 910A and 910B so that the first portion of the primary winding 910A between the end or start via 920 and the center tap 928 is in the top half of the PCB and the second portion of the primary 910B, between the other end or start via 934 and the center tap 928' is in the bottom half of the PCB. The auxiliary winding 912 is provided in the middle of the two primary winding portions 910A and 910B. The edge castellations 808a and 808b, and 808a' and 808b' at which power is received are separated one at the top edge and one at the bottom edge of the device. These power pins may be connected to respective power rails, such as for example +Vin at the top and −Vin at the bottom, or Vin and GND as appropriate.

As illustrated in FIG. 8, the two input side transistors TR1 and TR2 are also separated at each end of the PCB 806 in thermal proximity to the respective first and second primary winding portions and the castellations 808a, 808b and 808a'm 808b'. This may be achieved by including the first and second transistors TR1 and TR2 arranged to substantially overlap the second and third plurality of conductive traces 904 and vias 902.

This arrangement provides for an improved lay out compared with the comparative art examples discussed above, for a number of reasons.

First, as both transistors TR1 and TR2 are separated from each other at each end of the PCB, the heat produced by the transistors is spread evenly. Further, each transistor is close to its respective power pin (the respective edge castellation at the top and bottom edge of the device) where thermal conduction to the secondary or third-party PCB will be lowest. Further, each transistor is close to the start/end connection of its primary winding keeping these tracks short.

Second, the second and third pluralities of conductive traces forming each primary winding portion 910A and 910B can be made shorter than the comparative examples, because they are only required to cover in total one quarter of the core.

Further the tracks for the windings can be made wider than in the comparative examples because there is no need for one of the primary windings to be arranged in a bifilar configuration with the other primary winding. As power is routed to the center tap of the primary windings in the middle of the PCB, where the input decoupling capacitors are located, the transformer tracks that contain AC current are kept short.

The feedback windings 912 are placed in the center of the PCB, between the primary winding portions 910A and 910B, so that the shortest route to the base of each transistor is possible, and the electrical circuit to each transistor can be balanced. Short, well-placed transformer tracks mean no criss-crossing of the PCB, and power tracks from the input pins can now utilize large planes of copper.

Specifically, with the preferred embodiment described here, there is no need for a long center tap trace spanning the width of the device connection from one end of the first primary winding to the second. Overall, this transformer winding method makes the layout better than prior art methods for heat loss, heat spreading, low resistance, and low leakage inductance.

Figure 11:
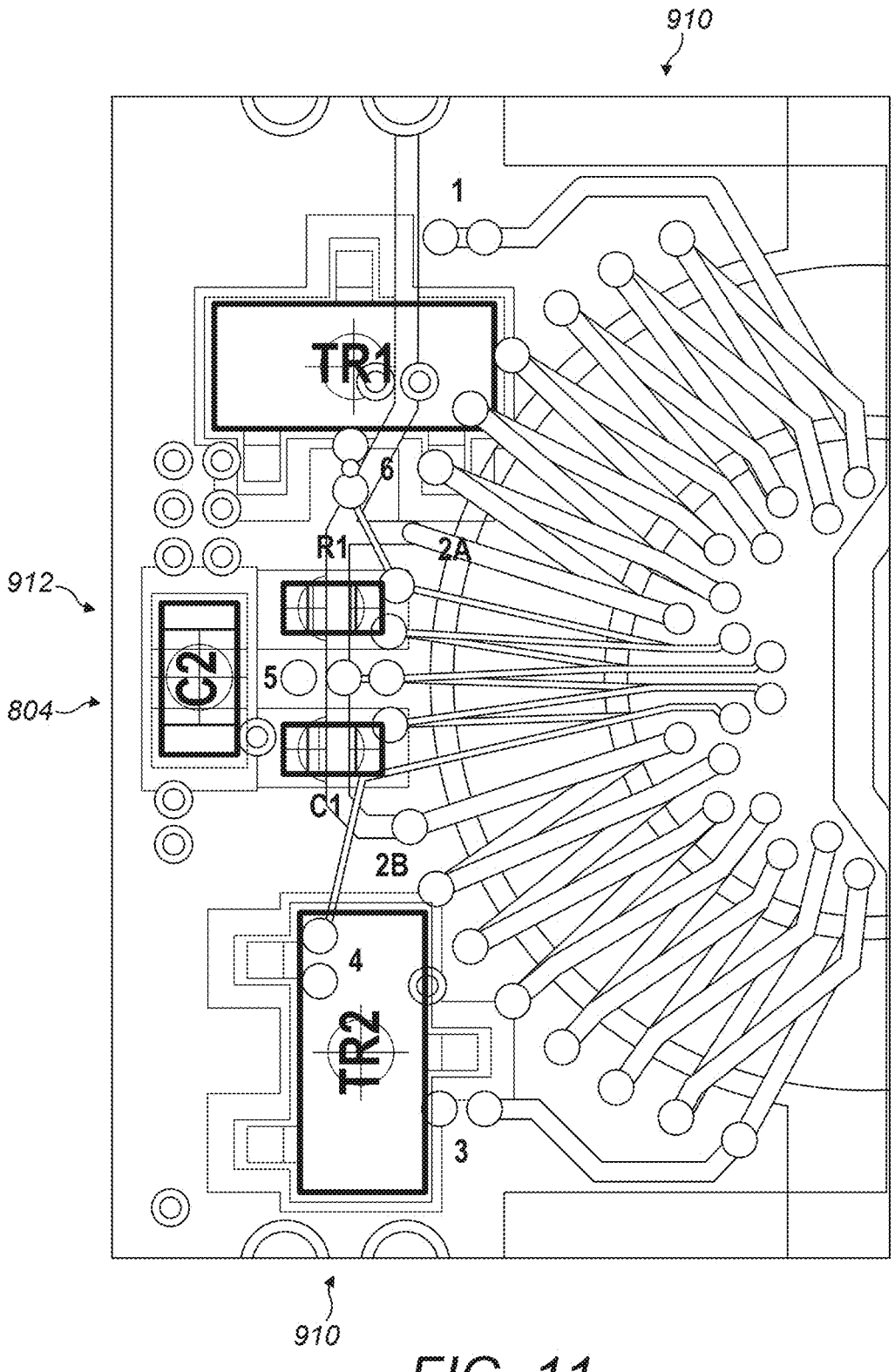
FIG. 11 illustrates a winding arrangement in which the two sections of the primary winding are separated spatially from each other.

FIG. 11 shows a close-up view of the first and second primary windings on the input side, with the auxiliary windings located in between. The arrangement presents a balanced and largely symmetrical spacing of the windings and the connected surface mounted electronic components. The power connections between the windings and the surface mounted components are also illustrated.

FIG. 11 also shows that the width of the conductive traces forming the primary winding may be greater than the width of conductive traces forming the auxiliary winding, and that the conductive vias in the inner region of the cavity are smaller than the conductive vias arranged around the outer periphery of the cavity.

Second Preferred Embodiment

Figure 12:
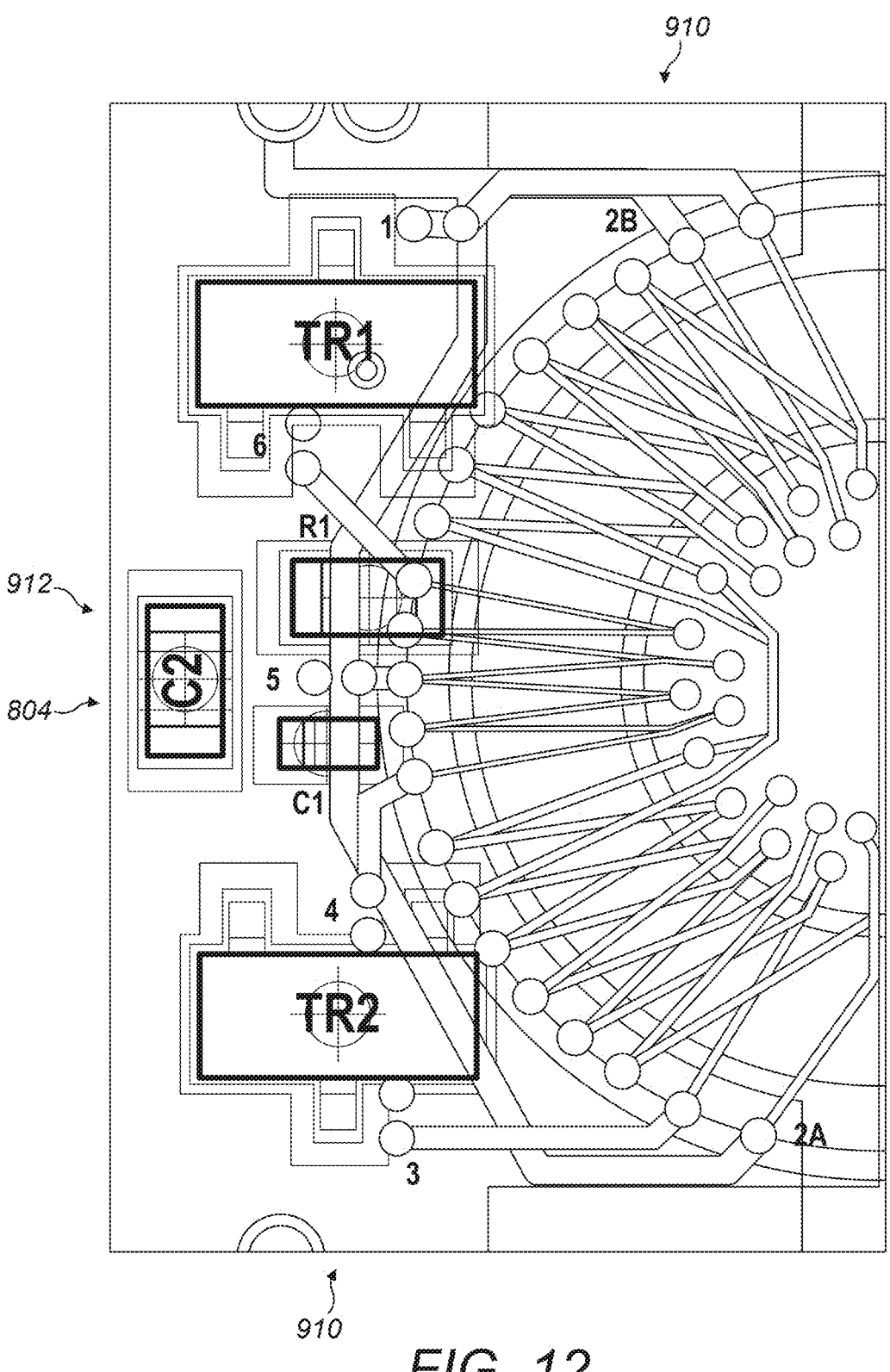
FIG. 12 illustrates a winding arrangement in which the two sections of the primary winding are interleaved or bifilar with respect to each other.

FIG. 12 shows a second preferred embodiment of the device of FIGS. 8 to 10, and differs from the arrangement of FIG. 11 in that the windings are arranged bifilar or interleaved with respect to another. In other respects, the details of the second preferred embodiment are identical to those of the first preferred embodiment.

It is not possible to provide wider traces for the primary as with the first preferred embodiment due to the windings being interleaved. However, the arrangement still provides the other advantages discussed above, and the traces of the primary winding can still be provided with a greater width than those of the auxiliary windings.

It is possible to also adopt a partially interleaved arrangement in which a proportion, say 50% for example, of each of the primary winding portions 910A and 910B are interleaved with each other. Other percentages by which the winding are interleaved may also be adopted as desired.

Other Features of the Preferred Embodiments

Although reference is made to conductive vias throughout the present application, it should be noted that any conductive connector, for example, conductive pins or filaments, can equally well be used in place of any one or more of the conductive vias. The conductive vias may be formed from plated via holes. Those elements referred to in the above description as copper planes and conducting traces can be made of any suitably conductive material and are not limited to copper conductors.

Although the conductive traces are shown as including an approximately uniform width along their length, it is also possible for the width to vary. For example, where there are fewer turns on the secondary winding compared to the primary winding, there may be space to allow the conductive traces of the second electrical winding to be wider. This reduces the resistance of the windings and therefore decreases the amount of heating they produce in operation. Any of the plurality of conductive traces belonging to the primary and secondary, or auxiliary windings, of only some of the conductive traces therein, can be of greater width than conductive traces of the other windings depending on the space available on the PCB.

The primary and secondary windings discussed in relation to the preferred embodiments and example above can be either a primary transformer windings connected to the input power supply of the transformer or a secondary transformer windings connected to the output of the transformer or vice versa. In this regard, primary and secondary are used to distinguish one side of the transformer from the other, rather than to necessarily indicate a function of operation.

The embedded transformer device can be either a step-up or step-down transformer.

Although in the examples above the magnetic core 830 and cavity 820 are illustrated as being circular in shape, they may include a different shape in other preferred embodiments. Non-limiting examples include an oval or elongate toroidal shape, a toroidal shape having a gap, EE, EI, I, EFD, EP, UI and UR core shapes. The magnetic core 830 may also be coated with an insulating material to reduce the possibility of breakdown occurring between the conductive magnetic core 830 and the conductive vias or metallic traces. The magnetic core 830 may also include chamfered edges providing a profile or cross section that is rounded.

Edge castellations are used in the design as they provide a number of advantages for manufacture and circuit design. They are typically formed as via holes in a substrate that are plated before the substrate is split, along the via holes, forming an edge to the device. Although, edge castellations are shown in this example, SMD (surface mounting device) pins or wiring or other techniques for connecting power to the circuit may be used.

In other preferred embodiments, different numbers of turns on the primary winding side and secondary winding side may be used to those discussed above and shown in the figures. Known Royer circuits for example may include 16 turns for the first electrical winding side and 18 turns for the second electrical winding side. The number of turns required for the second electrical winding side can be reduced by substituting the known Royer circuit configuration for a synchronized rectifier circuit.

In alternative preferred embodiments, the primary winding turns may be reduced, using a half bridge circuit configuration for the primary winding side and a standard Royer output for the secondary winding.

Alternatively, both of the first electrical winding and second electrical winding could include reduced turns, by using a half bridge circuit on the first electrical winding side, and a synchronized rectifier circuit on the second electrical winding side. This would reduce the number of turns required from the known Royer circuit configuration by 13. In all cases, reducing the number of turns means more flexibility in the design layout, bringing higher potential isolation between the components and the possibility of more even heat distribution. However, reducing the number of turns on the electrical winding requires only one additional transistor (e.g. in a FET dual package) to be added to the circuit. Reducing the number of turns of the first electrical winding requires a half bridge circuit to be provided meaning more components on the first electrical winding side compared with the known Royer design.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A device comprising:
a substrate with opposing first and second surfaces arranged in a thickness direction of the substrate;
conductive traces disposed on the first and the second surfaces;
conductive vias extending from the first surface to the second surface, wherein
the conductive traces and the conductive vias together define a primary winding, a secondary winding, and an auxiliary windings of a transformer,
the primary winding and the auxiliary windings are arranged on a primary side of a central isolation region of the transformer,
the secondary windings is arranged on a secondary side of the central isolation region of the transformer,
a first plurality of the conductive traces and the conductive vias define the auxiliary winding,
second and third pluralities of the conductive traces and the conductive vias define the primary winding,
the first plurality of the conductive traces and the conductive vias are arranged in between the second and the third pluralities of the conductive traces and the conductive vias.

2. The device of claim 1, further comprising:
a width dimension and a length dimension, and
opposing first and second device edges arranged along the width dimension, wherein
the primary side and the secondary side are arranged along the length dimension.

3. The device of claim 2, wherein the first and the second device edges include edge castellations that connect to a power supply.

4. The device of claim 3, wherein the first device edge include at least a first edge castellation that connect to one rail of the power supply, and the second device edge includes a second edge castellation that connect to another rail of the power supply.

5. The device of claim 2, wherein the first plurality of the conductive traces and the conductive vias are positioned substantially equidistant from the first and the second device edges arranged along the width direction.

6. The device of claim 5, wherein the second and the third pluralities of the conductive traces and the conductive vias extend from a position adjacent the auxiliary winding towards a respective one of the first and second device edges to terminate adjacent the respective one of the first and second device edges.

7. The device of claim 1, further comprising a plurality of surface mounted electronic components mounted on at least one of the first surface or the second surface, and connected to respective ones of the conductive traces.

8. The device of claim 7, wherein
the plurality of surface mounted electronic components include a first transistor and a second transistor that supply electrical signals to the primary winding,
the first transistor is arranged between the auxiliary winding and a first device edge, and
the second transistor is arranged between the auxiliary winding and a second device edge.

9. The device of claim 8, wherein the first transistor and the second transistor are arranged to substantially overlap respective ones of the second and the third pluralities of the conductive traces and the conductive vias.

10. The device of claim 1, wherein at least one of the primary winding, the auxiliary winding, and the secondary winding are provided with a center tap terminal.

11. The device of claim 1, wherein portions of the first and the second surfaces without the conductive traces or the conductive vias are covered with a conductive plate.

12. The device of claim 1, wherein
the substrate includes a toroidal or circular cavity, and
the conductive traces and the conductive vias are arranged around inner and outer peripheries of the toroidal or circular cavity.

13. The device of claim 12, further comprising a magnetic core embedded in the cavity.

14. The device of claim 1, wherein the second and the third pluralities of the conductive traces and the conductive vias are arranged in separate regions of the device.

15. The device of claim 1, wherein the second and the third pluralities of the conductive traces and the conductive vias are bifilar with respect to each other.

16. The device of claim 8, wherein the first transistor and the second transistor include respective first and second component housings arranged at 90° to each other.

17. The device of claim 13, wherein
the magnetic core includes a first section and a second section,
the primary and the auxiliary windings surround the first section, and
the secondary winding surrounds the second section.

18. The device of claim 8, wherein
the first transistor is operable to energize the second plurality of the conductive traces and the conductive vias,
the second transistor is operable to energize the third plurality of the conductive traces and the conductive vias, and
in operation, the second and third pluralities of the conductive traces and the conductive vias are energized alternately.

19. The device of claim 1, wherein
a fourth plurality of the conductive traces and the conductive vias define the secondary winding on the secondary side, and
conductive traces of the secondary winding are wider than conductive traces of the primary winding.

20. The device of claim 1, wherein the device includes a self-oscillating push-pull circuit.

* * * * *